US012557510B2

(12) United States Patent
Wang

(10) Patent No.: US 12,557,510 B2
(45) Date of Patent: Feb. 17, 2026

(54) DISPLAY PANEL AND DISPLAY DEVICE FOR IMPROVING LIGHT-EMITTING RATE AND PRODUCT LIFESPAN

(71) Applicants: Huizhou China Star Optoelectronics Display Co., Ltd., Huizhou (CN); Shenzhen China Star Optoelectronics Semiconductor Display Technology Co., Ltd., Shenzhen (CN)

(72) Inventor: Guojie Wang, Huizhou (CN)

(73) Assignees: Huizhou China Star Optoelectronics Display Co., Ltd., Huizhou (CN); Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 606 days.

(21) Appl. No.: 17/890,367

(22) Filed: Aug. 18, 2022

(65) Prior Publication Data

US 2024/0032374 A1    Jan. 25, 2024

(30) Foreign Application Priority Data

Jul. 19, 2022    (CN) .......................... 202210850492.8

(51) Int. Cl.
*H10K 59/35*    (2023.01)
*H10K 59/122*    (2023.01)

(52) U.S. Cl.
CPC ......... *H10K 59/353* (2023.02); *H10K 59/122* (2023.02); *H10K 59/352* (2023.02)

(58) Field of Classification Search
CPC .. H10K 59/353; H10K 59/352; H10K 59/122; H10K 59/351; H10H 29/142
(Continued)

(56) References Cited

U.S. PATENT DOCUMENTS

2015/0214280 A1* 7/2015 Furuie ................. H10K 59/352
                                                        257/89
2016/0124557 A1* 5/2016 Choi ..................... H10K 59/40
                                                        345/173
(Continued)

FOREIGN PATENT DOCUMENTS

CN        104465710        3/2015
CN        105702707        6/2016
(Continued)

OTHER PUBLICATIONS

Notification of Office Action and Search Report Dated Jan. 21, 2025 From The State Intellectual Property Office of the People's Republic of China Re. Application No. 2022/10850492.8 and Its Translation Into English. (21 Pages).

*Primary Examiner* — Didarul A Mazumder

(57) ABSTRACT

A display panel and a display device are provided in embodiments of the present application. The display panel includes a first sub-pixel, a second sub-pixel, and a third sub-pixel with different light-emitting colors. The first sub-pixel and the second sub-pixel are sequentially arranged along a first direction. The third sub-pixel is arranged on at least two sides of an area where the first sub-pixel and the second sub-pixel are located. The third sub-pixel is a sub-pixel with a shortest light-emitting lifespan in the pixel unit. Such design can make a pixel area ratio of the third sub-pixel be increased in a unit pixel area, reducing a current density of the third sub-pixel and reducing its decay speed, so that the lifespan of the third sub-pixel matches with lifespan of the first sub-pixel or the second sub-pixel.

20 Claims, 3 Drawing Sheets

(58) Field of Classification Search
USPC .......................................... 257/89; 438/22, 28
See application file for complete search history.

(56) References Cited

U.S. PATENT DOCUMENTS

| | | | | |
|---|---|---|---|---|
| 2016/0329384 | A1* | 11/2016 | Hou | H10K 59/353 |
| 2017/0194394 | A1* | 7/2017 | Hou | H10K 71/00 |
| 2018/0005561 | A1* | 1/2018 | Moon | H10K 59/352 |
| 2019/0206951 | A1* | 7/2019 | Xin | H10K 59/353 |
| 2020/0176530 | A1* | 6/2020 | Baek | H10K 59/352 |
| 2020/0357864 | A1* | 11/2020 | Xiao | H10K 59/353 |
| 2021/0202609 | A1* | 7/2021 | Park | H10K 59/352 |
| 2023/0133156 | A1* | 5/2023 | Hou | H10K 59/353 |
| | | | | 257/40 |

FOREIGN PATENT DOCUMENTS

| | | |
|---|---|---|
| CN | 109509779 | 3/2019 |
| CN | 110323260 | 10/2019 |
| CN | 111969016 | 11/2020 |

\* cited by examiner

DISPLAY PANEL AND DISPLAY DEVICE FOR IMPROVING LIGHT-EMITTING RATE AND PRODUCT LIFESPAN

CROSS-REFERENCE TO RELATED APPLICATION

This application claims priority to a Chinese patent application with an application date of Jul. 19, 2022, an application number of 202210850492.8, and an application title of "DISPLAY PANEL AND DISPLAY DEVICE", which is incorporated by reference in the present application in its entirety.

BACKGROUND OF DISCLOSURE

Technical Field

The present application relates to a field of display technology, and specifically, to a display panel and a display device.

Description of Prior Art

In terms of displays, organic light-emitting diode (OLED) devices are a mainstream development direction of displays at present because of their high contrast, fast response speed, lack of a backlight, lighter and thinner, and can meet future needs of consumers in flexible product forms.

At present, the OLED devices are mainly manufactured by evaporation or inkjet printing. However, the evaporation in large-scale applications faces problems such as mask deformation, substrate film wear, low material utilization rate, high equipment investment, and so on. Therefore, current development trend is to adopt an inkjet printing technology. However, in manufacturing of the OLED devices, an arrangement of light-emitting pixels generally adopts an arrangement similar to the liquid crystal display of red, green, and blue arrangement, and area ratios of red, green, and blue sub-pixels are similar. Wherein, due to a low light-emitting rate of the blue sub-pixel itself and short service lifespan, product lifespan of the OLED devices is low, which affects a display effect of the OLED devices.

Therefore, a new display panel and display device are needed to solve the above-mentioned technical problems.

BRIEF SUMMARY OF DISCLOSURE

A display panel and a display device are provided in embodiments of the present application, so as to improve a technical problem of shorter light-emitting lifespan of existing display panels.

The display panel is provided in the embodiments of the present application, which includes at least one pixel unit, and each pixel unit includes: a first sub-pixel, a second sub-pixel, and a third sub-pixel with different light-emitting colors; the first sub-pixel and the second sub-pixel sequentially arranged along a first direction; and the third sub-pixel arranged on at least two sides of an area where the first sub-pixel and the second sub-pixel are located; and the third sub-pixel is a sub-pixel with a shortest light-emitting lifespan in the pixel unit.

In the display panel provided in the embodiments of the present application, an orthographic projection area of the third sub-pixel on the display panel is greater than an orthographic projection area of the first sub-pixel on the display panel and/or an orthographic projection area of the second sub-pixel on the display panel; or the orthographic projection area of the third sub-pixel on the display panel is greater than a sum of the orthographic projection area of the first sub-pixel on the display panel and the orthographic projection area of the second sub-pixel on the display panel.

The display panel provided in the embodiments of the present application, the third sub-pixel comprises a first portion and a second portion connected to a first end of the first portion, and the second portion is arranged at an included angle with the first portion.

The display panel provided in the embodiments of the present application, the included angle formed between the first portion and the second portion ranges from 0° to 150°.

The display panel provided in the embodiments of the present application, the first portion is arranged on one side of the area where the first sub-pixel and the second sub-pixel are located, and the second portion is arranged on another side adjacent to the one side of the area where the first sub-pixel and the second sub-pixel are located; and wherein the second portion and the first sub-pixel are arranged at intervals, and the second portion and the second sub-pixel are arranged at intervals.

The display panel provided in the embodiments of the present application, the third sub-pixel further comprises a third portion connected to a second end of the first portion, and the third portion is arranged at an included angle with the first portion; and wherein the included angle formed between the third portion and the first portion ranges from 0° to 150°.

The display panel provided in the embodiments of the present application, the first portion is arranged on one side of the area where the first sub-pixel and the second sub-pixel are located, and the third portion is arranged on yet another side adjacent to the one side of the area where the first sub-pixel and the second sub-pixel are located; and wherein the third portion and the first sub-pixel are arranged at intervals, and the third portion and the second sub-pixel are arranged at intervals.

The display panel provided in the embodiments of the present application, the third sub-pixel further comprises a fourth portion; the first portion, the second portion, the third portion, and the fourth portion are combined into a closed pattern, and the first sub-pixel and the second sub-pixel are arranged in the closed pattern.

The display panel provided in the embodiments of the present application, at least one of the first sub-pixel and the second sub-pixel comprises a plurality of fifth portions arranged at intervals.

Accordingly, the display device is further provided in the embodiments of the present application, which includes the display panel in anyone of the above-mentioned embodiments.

The display panel and the display device are provided in embodiments of the present application. The display panel includes the first sub-pixel, the second sub-pixel, and the third sub-pixel with different light-emitting colors. The first sub-pixel and the second sub-pixel are sequentially arranged along the first direction; and the third sub-pixel is arranged on at least two sides of the area where the first sub-pixel and the second sub-pixel are located; and the third sub-pixel is the sub-pixel with the shortest light-emitting lifespan in the pixel unit. The third sub-pixel with the shortest light-emitting lifespan is arranged on at least two sides of the area where the first sub-pixel and the second sub-pixel are located in a same pixel unit, a pixel area ratio of the third sub-pixel is increased in a unit pixel area, reducing a current density of the third sub-pixel and reducing its decay speed, so as to improve a light-emitting rate of the third sub-pixel, so that the light-emitting lifespan of the third sub-pixel matches with light-emitting lifespan of the first sub-pixel or the second sub-pixel, further improving product lifespan of the display panel.

BRIEF DESCRIPTION OF DRAWINGS

In order to more clearly explain technical solutions in embodiments of the present application, the following will briefly introduce the drawings that need to be used in description of the embodiments. The drawings in the following description are only some embodiments of the present application. For those skilled in the art, other drawings can be obtained according to these drawings without making creative work.

DETAILED DESCRIPTION OF PREFERRED EMBODIMENTS

Figure 1:
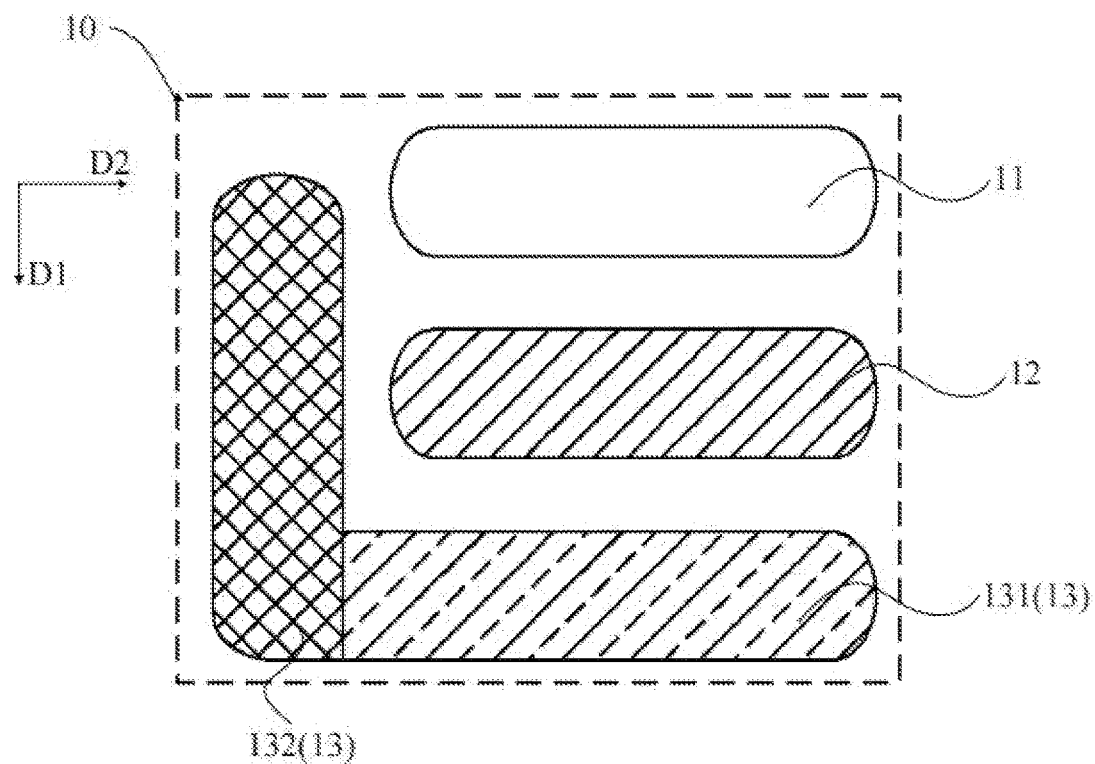
FIG. 1 is a schematic structural diagram of pixels of a display panel provided in a first embodiment of the present application.

Technical schemes in embodiments of the present application will be clearly and completely described below in combination with accompanying drawings in the embodiments of the present application. Obviously, the described embodiments are only part of the embodiments of the present application, not all of them. Based on the embodiments in this application, all other embodiments obtained by those skilled in the art without making creative work fall within a scope of protection of the present application.

A display panel and a display device are provided in the embodiments of the present application. The following is a detailed description. It should be noted that an order of description of the following embodiments is not a limitation of a preferred order of the embodiments. In addition, in the description of the present application, the term "including" refers to "including but not limited to". The terms "first", "second", "third", etc., are only used as signs, without imposing numerical requirements or establishing order. Various embodiments of this disclosure can exist in a range of forms. It should be understood that the description in a scope type is only for convenience and simplicity, and should not be understood as a rigid limitation on the scope of this disclosure. Therefore, it should be considered that the range description has specifically disclosed all possible sub ranges and single values within this range. For example, it should be considered that the range description from 1 to 6 has specifically disclosed sub ranges, such as from 1 to 3, from 1 to 4, from 1 to 5, from 2 to 4, from 2 to 6, from 3 to 6, etc., as well as a single number within the range, such as 1, 2, 3, 4, 5 and 6, which applies regardless of the range. In addition, whenever a numerical range is indicated here, it refers to any referenced number (fraction or integer) that includes the indicated range.

Please refer to FIGS. 1 to 5, a display panel and a display device are provided in the present application. The display panel includes at least one pixel unit 10, and each pixel unit 10 includes a first sub-pixel 11, a second sub-pixel 12, and a third pixel 13 with different light-emitting colors. The first sub-pixel 11 and the second sub-pixel 12 are sequentially arranged along a first direction D1. The third sub-pixel 13 is arranged on at least two sides of an area where the first sub-pixel 11 and the second sub-pixel 12 are located. The third sub-pixel 13 is a sub-pixel with a shortest light-emitting lifespan in the pixel unit 10.

The third sub-pixel 13 with the shortest light-emitting lifespan is arranged on at least two sides of the area where the first sub-pixel 11 and the second sub-pixel 12 are located in a same pixel unit 10, a pixel area ratio of the third sub-pixel 13 is increased in a unit pixel area, reducing a current density of the third sub-pixel 13 and reducing its decay speed, so as to improve a light-emitting rate of the third sub-pixel 13, so that the lifespan of the third sub-pixel 13 matches with lifespan of the first sub-pixel 11 or the second sub-pixel 12, further improving product lifespan of the display panel.

The technical scheme of the present application is described in combination with specific embodiments.

First Embodiment

As shown in FIG. 1, which is a schematic structural diagram of pixels of a display panel provided in the first embodiment of the present application. Wherein, the display panel includes at least one pixel unit 10, and each pixel unit 10 includes the first sub-pixel 11, the second sub-pixel 12, and the third pixel 13 with different light-emitting colors. The first sub-pixel 11 and the second sub-pixel 12 are sequentially arranged along a first direction D1, and the third sub-pixel 13 is arranged at least two sides of an area where the first sub-pixel 11 and the second sub-pixel 12 are located. The third sub-pixel 13 is the sub-pixel with a shortest light-emitting lifespan in the pixel unit 10.

Wherein, an orthographic projection area of the third sub-pixel 13 on the display panel is greater than an orthographic projection area of the first sub-pixel 11 on the display panel and/or an orthographic projection area of the second sub-pixel 12 on the display panel; or the orthographic projection area of the third sub-pixel 13 on the display panel is greater than a sum of the orthographic projection area of the first sub-pixel 11 on the display panel and the orthographic projection area of the second sub-pixel 12 on the display panel.

Specifically, in the first embodiment, the orthographic projection area of the third sub-pixel 13 on the display panel may be only greater than the orthographic projection area of the first sub-pixel 11 on the display panel. In a second embodiment, the orthographic projection area of the third sub-pixel 13 on the display panel may be only greater than the orthographic projection area of the second sub-pixel 12 on the display panel. In a third embodiment, the orthographic projection area of the third sub-pixel 13 on the display panel may be greater than any one of the orthographic projection area of the first sub-pixel 11 on the display panel or the orthographic projection area of the second sub-pixel 12 on the display panel. In a fourth embodiment, the orthographic projection area of the third sub-pixel 13 on the display panel may be greater than the sum of the orthographic projection area of the first sub-pixel 11 on the display panel and the orthographic projection area of the second sub-pixel 12 on the display panel.

In the embodiment of the present application, the first sub-pixel 11 and the second sub-pixel 12 are continuous linear structures. Wherein, the continuous linear structure is a pixel structure of linear barriers, which is to print a complete sub-pixel with a same color in an opening area of a same pixel definition layer.

Furthermore, a long side of the first sub-pixel 11 and a long side of the second sub-pixel 12 are parallel to a second direction D2, respectively, and the second direction D2 is perpendicular to the first direction D1.

In the embodiment of the present application, the light-emitting color of the first sub-pixel 11 is one of red or green, the light-emitting color of the second sub-pixel 12 is another one of red or green, and the light-emitting color of the third sub-pixel 13 is blue. That is to say, the light-emitting lifespan of the blue sub-pixel is shortest.

In the embodiment of the present application, the third sub-pixel 13 includes a first portion 131, and a second portion 132 connected to a first end of the first portion 131, and the second portion 132 is arranged at an included angle with the first portion 131.

Specifically, the included angle formed between the first portion 131 and the second portion 132 ranges from 0° to 180°, preferably from 0° to 150°. When the included angle formed between the first portion 131 and the second portion 132 is greater than 150°, a size of the pixel unit 10 will be increased, which is not conductive to improving resolution of the display panel.

Wherein, the included angle formed between the second portion 132 and the first portion 131 is preferably 90°, which can make full use of an inner space of the pixel unit 10, so that the first sub-pixel 11, the second sub-pixel 12, and the third sub-pixel 13 are arranged reasonably in the pixel unit 10, so as to reduce the size of the pixel unit 10. The pixel structure can arrange more pixel units 10 in a unit area of a display area, thereby improving resolution of the display device.

In the embodiment of the present application, the first portion 131 extends along the second direction D2, and the second direction D2 is perpendicular to the first direction D1. The first portion 131 is arranged on one side of the area where the first sub-pixel 11 and the second sub-pixel 12 are located, and the second portion 132 is arranged on another side adjacent to the one side of the area where the first sub-pixel 11 and the second sub-pixel 12 are located.

Wherein, the second portion 132 and the first sub-pixel 11 are arranged at intervals, and the second portion 132 and the second sub-pixel 12 are arranged at intervals. Optionally, in the embodiment of the present application, there are no restrictions on specific types of the display panels to which the pixel structure is applied, the display panels include, but not limited to, OLED display panels, micro light-emitting diodes (micro LED) display panels, or quantum dot light-emitting diodes (QLED) display panels, etc.

Optionally, in the embodiment of the present application, the pixel structure includes three of sub-pixels with three of different colors, which are mixed to subjectively present a certain color. When displaying, the display device calculates and determines a data signal of each sub-pixel according to color information required to be displayed by each pixel unit 10.

Specifically, sizes of the first sub-pixel 11, the second sub-pixel 12, and the first portion 131 along the first direction D1 can be same or different.

In the embodiment of the present application, when the sizes w1 of the first sub-pixel 11, the second sub-pixel 12, and the first portion 131 along the first direction D1 are same, at this time, the sizes w1 range from 5 um to 50 um. When the sizes w1 are less than 5 um, high accuracy of an inkjet printing equipment is required, which will cause the sub-pixels with different light-emitting colors to be mixed, resulting in large yield loss. When the sizes w1 are greater than 50 um, due to a size limitation of the pixel unit 10 along the first direction D1, the sub-pixels with different light-emitting colors will be mixed, resulting in large yield loss.

In the embodiment of the present application, when there are at least two different sizes w1 among the first sub-pixel 11, the second sub-pixel 12, and the first portion 131 along the first direction D1, at this time, the size of the first portion 131 along the first direction D1 is set to be greater than the size of the first sub-pixel 11 or the second sub-pixel 12 along the first direction D1. This is because the lifespan of the blue sub-pixels is lower than the lifespan of the red sub-pixels and the green sub-pixels. Such design can reduce a current density of the blue sub-pixels and reduce their decay speed, so that the lifespan of the blue sub-pixels matches with the lifespan of the red sub-pixels and the green sub-pixels.

In the embodiment of the present application, sizes of the first sub-pixel 11, the second sub-pixel 12, and the first portion 131 along the second direction D2 can be same or different.

Specifically, when sizes w2 of the first sub-pixel 11, the second sub-pixel 12, and the first portion 131 along the second direction D2 are same, at this time, the sizes w2 range from 90 um to 130 um. When the sizes w2 are less than 90 um, the light-emitting lifespan of the pixel unit 10 will be reduced. When the sizes w2 are greater than 130 um, due to a size limitation of the pixel unit 10 along the second direction D2, the sub-pixels with different light-emitting colors will be mixed, resulting in large yield loss.

In the embodiment of the present application, the first sub-pixel 11, the second sub-pixel 12, and the third sub-pixel 13 are all manufactured by an inkjet printing process. Wherein, the first sub-pixel 11, the second sub-pixel 12, and the first portion 131 are all continuous linear structures. Wherein, the continuous linear structure is the pixel structure of linear barriers, which is to print the complete sub-pixel with the same color in the opening area of the same pixel definition layer.

Furthermore, when the third sub-pixel 13 is formed by inkjet printing, the first portion 131 is only printed along the second direction D2, and there is no need to print the second portion 132. When forming the second portion 132, organic functional material ink is usually dripped into a predetermined pixel area corresponding to the third sub-pixel 13 by using a plurality of nozzles, and then a required film is obtained by drying. Wherein, on a substrate applied to a printing film-forming process, a pixel area of the second portion 132 corresponding to the substrate is defined with a groove to limit the organic functional material ink. When the organic functional material ink is printed to be used up in a pixel area of the first portion 131, the organic functional material ink will automatically flow into the pixel area of the second portion 132 along the groove. After the organic functional material ink is dried and baked, the organic functional material ink shrinks to form the second portion 132 within a limited ranged of the groove corresponding to the pixel area of the second portion 132.

In the embodiment of the present application, a distance between the first sub-pixel 11 and the second sub-pixel 12 along the first direction D1 and a distance between the second sub-pixel 12 and the first portion 131 along the first direction D1 are w3, and sizes w3 range from 10 um to 16 um, preferably 12 um. When the sizes w3 are less than 10 um, the high accuracy of the inkjet printing equipment is required, which will cause the sub-pixels with different light-emitting colors to be mixed, resulting in large yield loss. When the sizes w3 are greater than 16 um, due to the size limitation of the pixel unit 10 along the first direction D1, the light-emitting lifespan of the pixel unit 10 will be reduced.

In the embodiment of the present application, a distance between the second portion 132 and the first sub-pixel 11 or the second sub-pixel 12 along the second direction D2 is w4, and the size w4 ranges from 15 um to 25 um, preferably 20 um. When the size w4 is less than 15 um, the high accuracy of the inkjet printing equipment is required, which will cause the third sub-pixel 13 and the first sub-pixel 11 or the second sub-pixel 12 to be mixed, resulting in the large yield loss. When the size w4 is greater than 25 um, the size of the first portion 131 along the second direction D2 will be increased, due to the size limitation of the pixel unit 10 along the second direction D2, the sub-pixels with different light-emitting colors will be mixed, resulting in the large yield loss.

In the embodiment of the present application, the size of the first portion 131 along the first direction D1 is greater than the size of the first sub-pixel 11 or the second sub-pixel 12 along the first direction D1. Such design can make the pixel area ratio of the third sub-pixel 13 be increased in a unit pixel area of the unit pixel unit 10, reducing the current density of the third sub-pixel 13 and reducing its decay speed, so as to improve the light-emitting rate of the third sub-pixel 13, so that the lifespan of the third sub-pixel 13 matches with the lifespan of the first sub-pixel 11 or the second sub-pixel 12, further improving the product lifespan of the display panel.

In the embodiment of the present application, a size of the second portion 132 along the second direction D2 is less than or equal to the size of the first portion 131 along the first direction D1, which can reduce a risk of color mixing between the second portion 132 and the first sub-pixel 11 or the second sub-pixel 12, thereby increasing yield of the display panel.

In the embodiment of the present application, the sizes w1 of the first sub-pixel 11, the second sub-pixel 12, and the first portion 131 along the first direction D1 are 36 um. The sizes w2 of the first sub-pixel 11, the second sub-pixel 12, and the first portion 131 along the second direction D2 are 127 um. At a same time, a size of the second portion 132 along the first direction D1 is 132 um, and the size of the second portion 132 along the second direction D2 is 28 um.

Wherein, the distance between the first sub-pixel 11 and the second sub-pixel 12 and the distance between the second sub-pixel 12 and the first portion 131 along the first direction D1 are 12 um. The distance between the second portion 132 and the first sub-pixel 11 or the second sub-pixel 12 along the second direction D2 is 20 um.

Optionally, in the embodiment of the present application, the display panel includes a first pixel definition layer with an entire surface structure. The first pixel definition layer includes a plurality of first openings, and any one of the first sub-pixel 11, the second sub-pixel 12, and the third sub-pixel 13 is provided in each of the first openings. A material of the first pixel definition layer is lyophobic photoresist. Wherein, the material of the first pixel definition layer is set as a lyophobic material, which can prevent pixels color mixing caused by local abnormalities in a process of pixels manufacturing.

In terms of a technical problem of shorter light-emitting lifespan of existing display panels, the display panel is provided in the embodiment of the present application. The display panel includes at least one pixel unit 10, and each pixel unit 10 includes the first sub-pixel 11, the second sub-pixel 12, and the third sub-pixel 13 with different light-emitting colors. The first sub-pixel 11 and the second sub-pixel 12 are sequentially arranged along the first direction D1, and the third sub-pixel 13 is arranged at least two sides of the area where the first sub-pixel 11 and the second sub-pixel 12 are located. The third sub-pixel 13 is the sub-pixel with the shortest light-emitting lifespan in the pixel unit 10. The third sub-pixel 13 with the shortest light-emitting lifespan is arranged on at least two sides of the area where the first sub-pixel and the second sub-pixel are located in the same pixel unit 10 in the embodiment of the present application, so that the pixel area ratio of the third sub-pixel 13 is increased in the unit pixel area, reducing the current density of the third sub-pixel 13 and reducing its decay speed, so as to improve the light-emitting rate of the third sub-pixel 13, so that the lifespan of the third sub-pixel 13 matches with the lifespan of the first sub-pixel 11 or the second sub-pixel 12, further improving the product lifespan of the display panel.

Second embodiment

Figure 2:
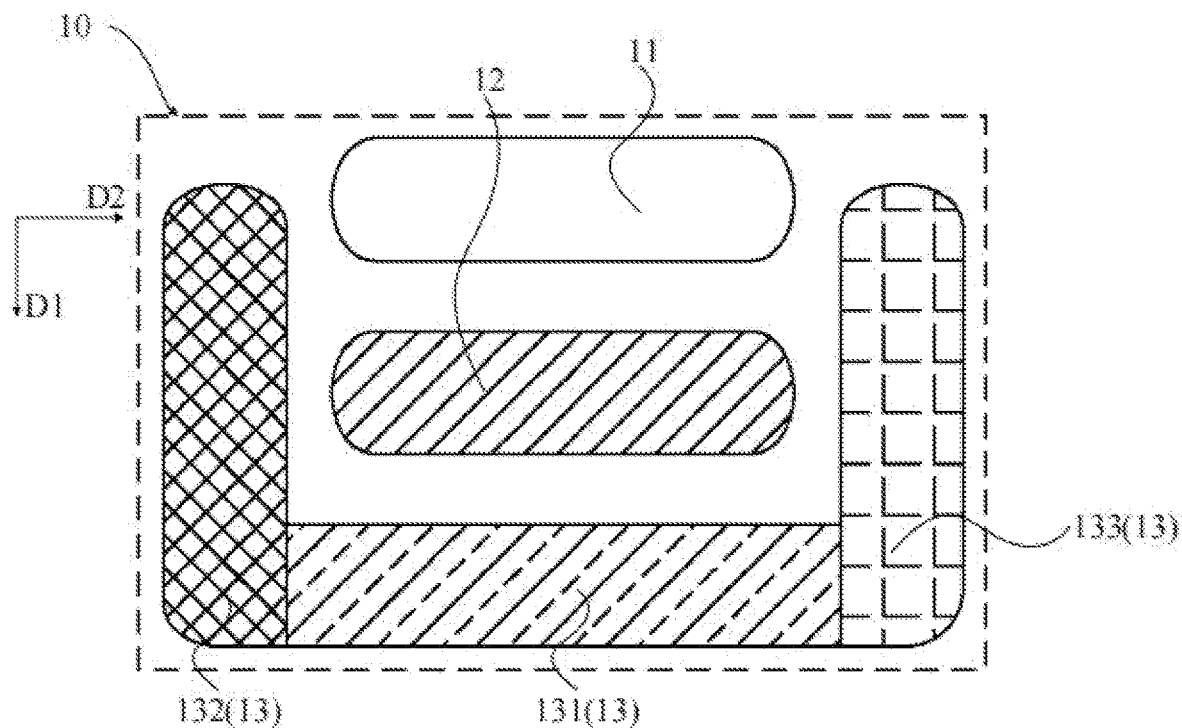
FIG. 2 is a schematic structural diagram of the pixels of the display panel provided in a second embodiment of the present application.

As shown in FIG. 2, which is a schematic structural diagram of the pixels of the display panel provided in the second embodiment of the present application. Wherein a difference between the second embodiment of the present application and the first embodiment of the present application is only that: the third sub-pixel 13 further includes a third portion 133 connected to a second end of the first portion 131, and the third portion 133 is arranged at an included angle with the first portion 131.

Wherein, the third portion 133 is arranged on yet another side adjacent to the one side of the area where the first sub-pixel 11 and the second sub-pixel 12 are located. The third portion 133 and the first sub-pixel 11 are arranged at intervals, and the third portion 133 and the second sub-pixel 12 are arranged at intervals.

In the embodiment of the present application, the included angle formed between the third portion 133 and the first portion 131 ranges from 0° to 180°, preferably from 0° to 150°. Wherein when the included angle formed between the third portion 133 and the first portion 131 is greater than 150°, the size of the pixel unit 10 will be increased, which is not conductive to improving the resolution of the display panel.

Specifically, the included angle between the third portion 133 and the first portion 131 is preferably 90°, which can make full use of the inner space of the pixel unit 10, so that the first sub-pixel 11, the second sub-pixel 12, and the third sub-pixel 13 can be reasonably arranged in the pixel unit 10, so as to reduce the size of the pixel unit 10, and the pixel structure can arrange more pixel units 10 in the unit pixel area of the display area, so as to improve the resolution of the display device. Furthermore, in the embodiment of the present application, the third portion 133 is arranged parallel to the first portion 131, which can further reduce the size of the pixel unit 10, so that the pixel structure can arrange more pixel units 10 in the unit pixel area of the display area, so as to improve the resolution of the display device.

Optionally, in the embodiment of the present application, a size of the third portion 133 along the first direction D1 is greater than or equal to the size of the second portion 132 along the first direction D1, which can further increase the pixel area ratio of the third sub-pixel 13 in the unit pixel area of the pixel unit 10.

Compared with the first embodiment of the present application, the second embodiment of the present application increases the pixel area ratio of the third sub-pixel 13 in the unit pixel area of the pixel unit 10, reducing the current density of the third sub-pixel 13 and reducing its decay speed, so as to improve the light-emitting rate of the third sub-pixel 13, so that the lifespan of the third sub-pixel 13 matches with the lifespan of the first sub-pixel 11 or the second sub-pixel 12, thus improving the product lifespan of the display panel.

Third embodiment

Figure 3:
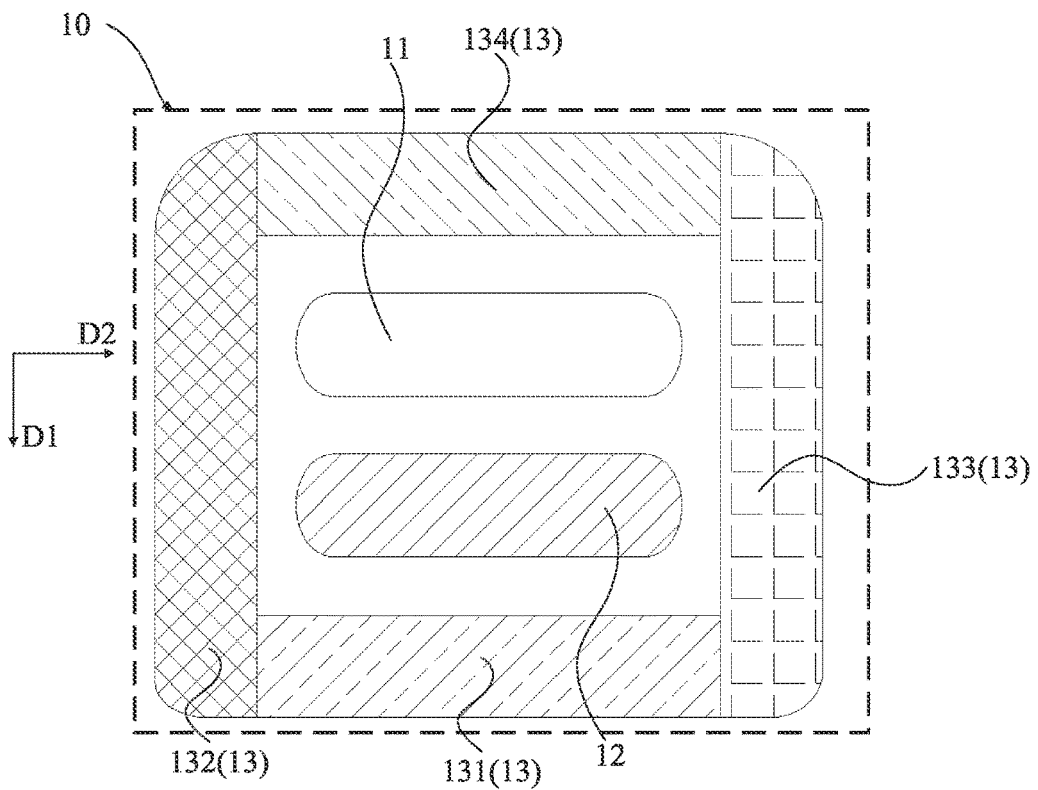
FIG. 3 is a schematic structural diagram of the pixels of the display panel provided in a third embodiment of the present application.

As shown in FIG. 3, which is a schematic structural diagram of the pixels of the display panel provided in the third embodiment of the present application. Wherein, a difference between the third embodiment of the preset application and the second embodiment of the present application is only that:

The third sub-pixel 13 further includes a fourth portion 134, and the fourth portion 134 is located on one side of the first sub-pixel 11 away from the first portion 131.

Wherein, the first portion 131, the second portion 132, the third portion 133, and the fourth portion 134 are combined into a closed pattern, and the first sub-pixel 11 and the second sub-pixel 12 are located in the closed pattern.

Optionally, in the embodiment of the present application, a size of the fourth portion 134 along the first direction D1 is greater than or equal to the size of the first portion 131 along the first direction D1, which can further increase the pixel area of the third sub-pixel 13, so as to increase the pixel area ratio of the third sub-pixel 13 in the unit pixel area of the pixel unit 10.

Compared with the second embodiment of the present application, the third embodiment of the present application further increases the pixel area of the third sub-pixel 13 in the unit pixel area of the pixel unit 10, so as to increase the pixel area ratio of the third sub-pixel 13 in the unit pixel area of the pixel unit 10, reducing the current density of the third sub-pixel 13 and reducing its decay speed, so as to improve the light-emitting rate of the third sub-pixel 13, so that the lifespan of the third sub-pixel 13 matches with the lifespan of the first sub-pixel 11 or the second sub-pixel 12, further improving the product lifespan of the display panel.

Fourth embodiment

Figure 4:
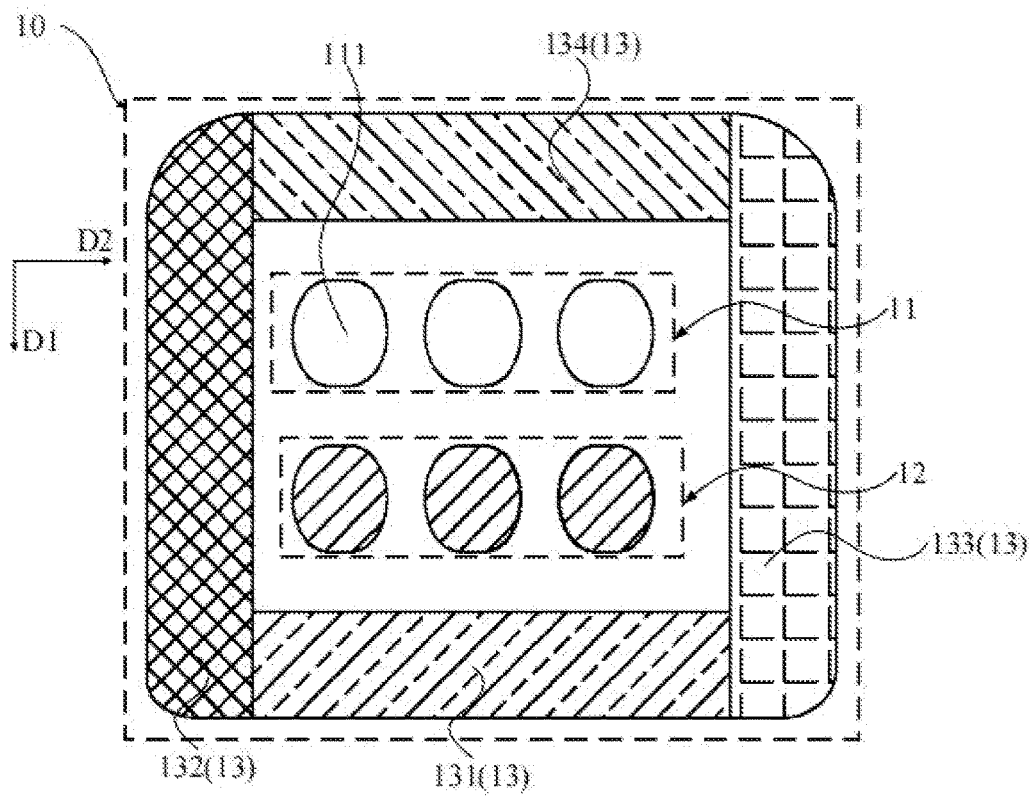
FIG. 4 is a schematic structural diagram of the pixels of the display panel provided in a fourth embodiment of the present application.

As shown in FIG. 4, which is a schematic structural diagram of the pixels of the display panel provided in the fourth embodiment of the present application. Wherein, a different between the fourth embodiment of the present application and the third embodiment of the present application is only that:

At least one of the first sub-pixel 11 and the second sub-pixel 12 includes a plurality of fifth portions 111 arranged at intervals along the second direction D2, and the second direction D2 is perpendicular to the first direction D1.

In the embodiment of the present application, the first sub-pixel 11 and the second sub-pixel 12 are pixel structures arranged side by side, and the plurality of fifth portions 111 have independent organic light-emitting components.

Furthermore, a size of the fifth portion 111 along the second direction D2 is less than a size of the third sub-pixel 13 along the second direction D2, which can further reduce pixel areas of the first sub-pixel 11 and the second sub-pixel 12, so as to increase the pixel area ratio of the third sub-pixel 13 in the unit pixel area of the pixel unit 10.

Compared with the third embodiment of the present application, the fourth embodiment of the present application reduces the pixel areas of the first sub-pixel 11 and the second sub-pixel 12, so as to increase the pixel area ratio of the third sub-pixel 13 in the unit pixel area of the pixel unit 10, reducing the current density of the third sub-pixel 13 and reducing its decay speed, so as to improve the light-emitting rate of the third sub-pixel 13, so that the lifespan of the third sub-pixel 13 matches with the lifespan of the first sub-pixel 11 or the second sub-pixel 12, thus improving the product lifespan of the display panel.

Because a greater the pixel area ratio of the third sub-pixel 13 in the unit pixel area of the pixel unit 10, the current density of the third sub-pixel 13 can be further reduced, and its decay speed can be reduced, so that the light-emitting rate of the third sub-pixel 13 can be increased more, so that the product lifespan of the display panel can be further improved.

Therefore, the technical scheme in the fourth embodiment is an optimal technical scheme of the present application.

Figure 5:
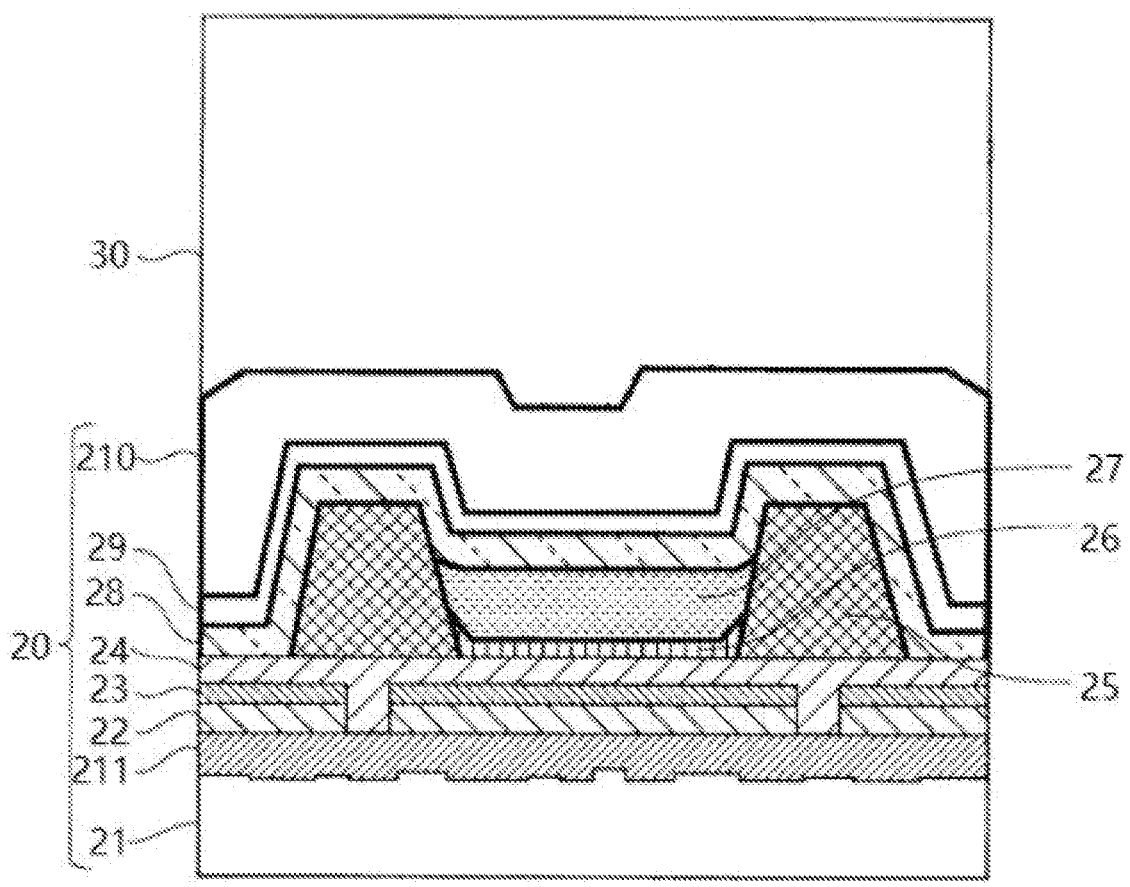
FIG. 5 is a schematic diagram of a stacking state of each layer of the display panel provided in the embodiment of the present application.

Please refer to FIG. 5, which is a schematic diagram of a stacking state of each layer of the display panel provided in the embodiment of the present application. As shown in FIG. 5, the display panel provided in the embodiment of the present application includes a structure for manufacturing an organic light-emitting element 20 on a thin film transistor array substrate 21. The structure further includes a sealing member 30 used for sealing the display panel, and the sealing member 30 is arranged on an encapsulation layer 210.

The organic light-emitting element 20 is an organic light-emitting element with a top light-emitting type, which is configured by each pixel of RGB with a minimum repetition unit (including only one first sub-pixel 11, one second sub-pixel 12, and one third sub-pixel 13). Each pixel is configured by stacking each layer on the thin film transistor array substrate 21.

A planarization layer 211 is formed on the thin film transistor array substrate 21. A first anode electrode 22 and a second anode electrode 23 of an anode metal layer are configured on the planarization layer 211, and a hole injection layer 24 is stacked on the first anode electrode 22 and the second anode electrode 23. A pixel definition layer 25 with specified pixels is formed on the hole injection layer 24, and a hole transport layer 26 and an organic light-emitting layer 27 are sequentially stacked in an area (light-emitting area) specified by the pixel definition layer 25. Moreover, an electron transport layer 28, a cathode electrode 29 as a cathode metal layer, and the encapsulation layer 210 are formed on the organic light-emitting layer 27 in a manner that exceeds the area specified by the pixel definition layer 25 and is continuous with the electron transport layer 28, the cathode electrode 29, and the encapsulation layer 210 of adjacent pixels, respectively.

The area specified by the pixel definition layer 25 becomes a multilayer stacked structure in which the hole injection layer 24, the hole transport layer 26, the organic light-emitting layer 27, and the electron transport layer 28 are stacked in order, and these stacked structures constitute a light-emitting functional layer. In addition, the light-emitting function layer can also include other layers, such as an electron injection layer.

The thin film transistor array substrate 21 is a substrate with amorphous thin film transistors formed on a base substrate composed of insulating materials such as alkali-free glass, sodium glass, non-fluorescent glass, phosphate glass, borate glass, quartz, acrylic resin, styrene resin, polycarbonate resin, epoxy resin, polyethylene, polyester, polysiloxane resin, or aluminum oxide.

The first anode electrode 22 is formed of silver, an alloy of silver, palladium, and copper (AgPdCu, APC), an alloy of silver, rubidium, and gold (AgRbAu, ARA), an alloy of molybdenum and chromium (MoCr), or an alloy of nickel and chromium (NiCr), and the like. In a case of the organic light-emitting element with the top light-emitting type, the first anode electrode 22 is preferably formed of a light reflective material.

The second anode electrode 23 is located between the first anode electrode 22 and the hole injection layer 24, and has a function of making bonding between adjacent two layers good.

The hole injection layer 24 is preferably formed of a metal compound such as a metal oxide, a metal nitride, or a metal oxynitride. When the hole injection layer 24 is formed of metal oxide, injection of holes becomes easy, so electrons in the organic light-emitting layer 27 effectively contribute to light-emitting, and good light-emitting characteristics can be obtained. As metal oxides, for example, chromium (Cr), molybdenum (Mo), tungsten (W), vanadium (V), niobium (Nb), tantalum (Ta), titanium (Ti), zirconium (Zr), hafnium (Hf), scandium (Sc), yttrium (Y), thorium (Th), manganese (Mn), iron (Fe), ruthenium (Ru), osmium (Os), cobalt (Co), nickel (Ni), copper (Cu), zinc (Zn), cadmium (Cd), aluminum (Al), gallium (Ga), indium (In), silicon (Si), germanium (Ge), tin (Sn), lead (Pb), antimony (Sb), bismuth (Bi), and oxides of so-called rare earth elements from lanthanum (La) to lutetium (Lu). Wherein, alumina, copper oxide, and silicon oxide are especially effective for prolonging lifespan.

Optionally, the pixel definition layer 25 is the first pixel definition layer with the entire surface structure, and the first pixel definition layer includes the plurality of first openings, each of the first openings is provided with any one of the first sub-pixel 11, the sub-pixel with continuous linear structure in the second sub-pixel 12, the second portion 132, and the third portion 133, preferably the lyophobic photoresist material.

The material of the first pixel definition layer is set as the lyophobic material, which can prevent pixels color mixing caused by local abnormalities in the process of pixel manufacturing.

Specifically, the hole transport layer 26 has a function of transporting holes injected from the first anode electrode 22 and the second anode electrode 23 to the organic light-emitting layer 27, preferably, for example, the hole transport layer 26 is formed of poly(3,4-ethylenedioxythiophene) (PEDOT:PSS) doped with polystyrene sulfonic acid, and its derivatives (copolymers, etc.).

Specifically, the organic light-emitting layer 27 has a function of emitting light using a field luminescence phenomenon.

Specifically, the electron transport layer 28 has a function of transporting electrons injected from the cathode electrode 29 to the organic light-emitting layer 27, preferably, for example, the electron transport layer 28 is formed of barium, phthalocyanine, lithium fluoride, or their mixtures.

For example, the cathode electrode 29 is formed of indium tin oxide, indium zinc oxide, and the like. In the case of the organic light-emitting element with the top light-emitting type, it is preferably formed of a light transmissive material.

The encapsulation layer 210 has a function of inhibiting exposure of the organic light-emitting layer 27 and the like to water or air, for example, the encapsulation layer 210 is formed of silicon nitride, silicon oxynitride, and other materials. In the case of the organic light-emitting element with the top light-emitting type, it is preferably formed of the light transmissive material.

The following table 1 shows a comparison table of the light-emitting lifespan results of the third sub-pixel 13 in the second embodiment and a comparative embodiment (the pixel structure of the third sub-pixel 13 is not changed).

TABLE 1

| | V'@J10 (V) | J (mA/cm$^2$) | V (V) | I (mA) | CIEx | CIEy | Peak (nm) | LT95@J44 (h) |
|---|---|---|---|---|---|---|---|---|
| comparative embodiment | 3.7 | 34.31 | 4.5 | 0.99 | 0.141 | 0.057 | 461 | 46 |
| second embodiment of the present application | 3.7 | 24.48 | 4.35 | 0.96 | 0.138 | 0.054 | 463 | 60 |

Wherein, V' is a light-emitting voltage at an initial brightness, J is a current density, V is a light-emitting voltage at 1000 nits brightness, J is a current density at 1000 nits brightness, CIEx is a red component value of CIE1931 chromaticity diagram, CIEy is a green component value of CIE1931 chromaticity diagram, and Peak is a blue spectral wavelength, LT95@J44 is a lifespan. The display panel tested above is a 65-inch display screen with a resolution of 7680*4320 (8K), that is to say, the display panel is provided with 7680 minimum repeating units in the first direction D1 and 4320 minimum repeating units in the second direction D2.

In the embodiment of the present application, a pixel size of each of the minimum repeating units in the second embodiment is as follows:

The sizes w1 of the first sub-pixel 11, the second sub-pixel 12, and the first portion 131 along the first direction are 36 um. The sizes w2 of the first sub-pixel 11, the second sub-pixel 12, and the first portion 131 along the second direction D2 are 127 um. At a same time, the size of the second portion 132 along the first direction D1 is 132 um, and the size of the second portion 132 along the second direction D2 is 28 um.

Wherein, the distance between the first sub-pixel 11 and the second sub-pixel 12 along the first direction D1 and the distance between the second sub-pixel 12 and the first portion 131 along the first direction D1 are 12 um. The distance between the second portion 132 and the first sub-pixel 11 or the second sub-pixel 12 along the second direction D2 is 20 um.

In the embodiment of the present application, the pixel size of each of the minimum repetition units in the comparative embodiment is as follows:

The sizes w1 of the first sub-pixel 11, the second sub-pixel 12, and the first portion 131 along the first direction D1 are 36 um; and the sizes w2 of the first sub-pixel 11, the second sub-pixel 12, and the first portion 131 along the second direction D2 are 127 um.

Wherein, the distance between the first sub-pixel 11 and the second pixel 12 along the first direction D1 and the distance between the second sub-pixel 12 and the first portion 131 along the first direction D1 are 12 um.

According to comparative experimental results, in a same minimum repetition unit, when the area of the third sub-pixel 13 is increased, the current density of the organic light-emitting device under 1000 nits brightness becomes less (the current density under 1000 nits brightness in the comparative embodiment is 34.31 mA/cm$^2$, which is greater than the current density of 24.48 mA/cm$^2$ under 1000 nits brightness in the second embodiment of the present application). The product lifespan of the organic light-emitting device at 1000 nits brightness increases (the light-emitting lifespan at 1000 nits brightness is 46 h, which is less than the light-emitting life of 60 h at 1000 nits brightness in the second embodiment of the present application).

Accordingly, the display device is further provided in the embodiment of the present application. The display device includes the display panel in the above-mentioned embodiments. Wherein, the display device can be mobile phones, computers, televisions, intelligent wearable display devices, etc., which is not specially limited in this embodiment.

In summary, the display panel and the display device are provided in the embodiments of the present application. The display panel includes at least one pixel unit 10, and each pixel unit 10 includes the first sub-pixel 11, the second sub-pixel 12, and the third sub-pixel 13 with different light-emitting colors. The first sub-pixel 11 and the second sub-pixel 12 are sequentially arranged along the first direction D1; and the third sub-pixel 13 is arranged on at least two sides of the area where the first sub-pixel 11 and the second sub-pixel 12 are located; and the third sub-pixel 13 is the sub-pixel with the shortest light-emitting lifespan in the pixel unit 10. The third sub-pixel 13 with the shortest light-emitting lifespan is arranged on at least two sides of the area where the first sub-pixel 11 and the second sub-pixel 12 are located in the same pixel unit 10, so that the pixel area ratio of the third sub-pixel 13 is increased in the unit pixel area, reducing the current density of the third sub-pixel 13 and reducing its decay speed, so as to improve the light-emitting rate of the third sub-pixel 13, so that the lifespan of the third sub-pixel 13 matches with the lifespan of the first sub-pixel 11 or the second sub-pixel 12, further improving the product lifespan of the display panel.

In the above-mentioned embodiments, the description of each embodiment has its own emphasis. For a part not detailed in one embodiment, please refer to the relevant description of other embodiments.

The above describes in detail the display panel and the display device provided by the embodiments of the present application. In this paper, specific examples are applied to explain the principle and implementation mode of the present application. The description of the above-mentioned embodiment is only used to help understand the method and core idea of the present application. At the same time, for those skilled in the art, there will be changes in the specific implementation mode and application scope according to the idea of the present application. In conclusion, the content of the specification should not be understood as a limitation of the present application.

What is claimed is:

1. A display panel, comprising:
at least one pixel unit, and the at least one pixel unit comprising:
a first sub-pixel, a second sub-pixel, and a third sub-pixel with different light-emitting colors; and
the third sub-pixel is a sub-pixel with a shortest light-emitting lifespan in the at least one pixel unit;
wherein the third sub-pixel comprises a first portion and a second portion connected to a first end of the first portion, the first sub-pixel, the second sub-pixel and the first portion are sequentially arranged at intervals along a first direction and extend along a second direction; and
wherein a size of the second portion along the second direction is less than a size of the first portion along the first direction.

2. The display panel as claimed in claim 1, wherein an orthographic projection area of the third sub-pixel on the display panel is greater than an orthographic projection area of the first sub-pixel on the display panel and/or an orthographic projection area of the second sub-pixel on the display panel; or the orthographic projection area of the third sub-pixel on the display panel is greater than a sum of the orthographic projection area of the first sub-pixel on the display panel and the orthographic projection area of the second sub-pixel on the display panel.

3. The display panel as claimed in claim 1, wherein the second portion is arranged at an included angle with the first portion, a long side of the second portion is parallel to the first direction, and the second direction is perpendicular to the first direction.

4. The display panel as claimed in claim 3, wherein the included angle formed between the first portion and the second portion ranges from 0° to 150°.

5. The display panel as claimed in claim 3, wherein the first portion is arranged on one side of the area where the first sub-pixel and the second sub-pixel are located, and the second portion is arranged on another side adjacent to the one side of the area where the first sub-pixel and the second sub-pixel are located.

6. The display panel as claimed in claim 5, wherein the third sub-pixel further comprises a third portion connected to a second end of the first portion, and the third portion is arranged at an included angle with the first portion; and
wherein the included angle formed between the third portion and the first portion ranges from 0° to 150°.

7. The display panel as claimed in claim 6, wherein the first portion is arranged on one side of the area where the first sub-pixel and the second sub-pixel are located, and the third portion is arranged on yet another side adjacent to the one side of the area where the first sub-pixel and the second sub-pixel are located; and
wherein the third portion and the first sub-pixel are arranged at intervals, and the third portion and the second sub-pixel are arranged at intervals.

8. The display panel as claimed in claim 6, wherein the third sub-pixel further comprises a fourth portion; the first portion, the second portion, the third portion, and the fourth portion are combined into a closed pattern, and the first sub-pixel and the second sub-pixel are arranged in the closed pattern.

9. The display panel as claimed in claim 8, wherein at least one of the first sub-pixel and the second sub-pixel comprises a plurality of fifth portions arranged at intervals.

10. A display device, comprising the display panel as claimed in claim 1.

11. The display panel as claimed in claim 1, wherein both the first sub-pixel and the second sub-pixel are continuous linear structures.

12. The display panel as claimed in claim 3, wherein sizes of the first sub-pixel, the second sub-pixel, and the first portion along the first direction can be same or different.

13. The display panel as claimed in claim 12, wherein in a case that the sizes of the first sub-pixel, the second sub-pixel, and the first portion along the first direction are same, the sizes range from 5 μm to 50 um.

14. The display panel as claimed in claim 12, wherein in a case that at least two of the sizes of the first sub-pixel, the second sub-pixel, and the first portion along the first direction are different, the size of the first portion along the first direction is set to be greater than the size of the first sub-pixel or the second sub-pixel along the first direction.

15. The display panel as claimed in claim 3, wherein sizes of the first sub-pixel, the second sub-pixel, and the first portion along a second direction can be same or different.

16. The display panel as claimed in claim 15, wherein in a case that the sizes of the first sub-pixel, the second sub-pixel, and the first portion along the second direction are same, at this time, the sizes range from 90 μm to 130 μm.

17. The display panel as claimed in claim 16, wherein on a substrate applied to a printing film-forming process, a pixel area of the second portion corresponding to the substrate is defined with a groove to limit an organic functional material ink.

18. The display panel as claimed in claim 3, wherein a distance between the first sub-pixel and the second sub-pixel along the first direction D1 and a distance between the second sub-pixel and the first portion along the first direction are w3, and the w3 range from 10 μm to 16 μm.

19. The display panel as claimed in claim 3, wherein a distance between the second portion and the first sub-pixel or the second sub-pixel along the second direction is w4, and the w4 ranges from 15 μm to 25 μm.

20. The display panel as claimed in claim 1, wherein the display panel further comprises a first pixel definition layer with an entire surface structure, the first pixel definition layer comprises a plurality of first openings, and one of the first sub-pixel, the second sub-pixel, and the third sub-pixel is disposed in each of the plurality of first openings, and a material of the first pixel definition layer is lyophobic photoresist.

* * * * *